United States Patent [19]
Eriksson et al.

[11] Patent Number: 6,131,275
[45] Date of Patent: Oct. 17, 2000

[54] METHODS AND DEVICES RELATING TO CIRCUIT BOARD CONSTRUCTIONS

[75] Inventors: Leif Eriksson, Stockholm; Otto Johnsson, Bromma, both of Sweden

[73] Assignee: Telefonaktiebolaget LM Ericsson, Stockholm, Sweden

[21] Appl. No.: 08/993,778

[22] Filed: Dec. 18, 1997

[30] Foreign Application Priority Data

Dec. 20, 1996 [SE] Sweden ................................. 9604704

[51] Int. Cl.$^7$ ....................................................... H05K 3/30
[52] U.S. Cl. ........................... 29/832; 29/830; 371/22.5; 324/73.1
[58] Field of Search ............................. 29/832, 830, 739, 29/741, 840, 593; 324/68.1, 158; 371/22.5; 257/668, 701, 702, 711; 361/760, 777

[56] References Cited

U.S. PATENT DOCUMENTS

| | | | |
|---|---|---|---|
| 5,049,814 | 9/1991 | Walker, III et al. | 324/158 |
| 5,199,035 | 3/1993 | Lopez et al. | 371/68.1 |
| 5,224,055 | 6/1993 | Grundy et al. | 364/448 |
| 5,404,359 | 4/1995 | Gillenwater et al. | 371/22.5 |
| 5,432,464 | 7/1995 | Darnaut | 326/51 |
| 5,508,636 | 4/1996 | Mange et al. | 326/38 |

FOREIGN PATENT DOCUMENTS

| | | |
|---|---|---|
| 0 210277 | 2/1987 | European Pat. Off. . |
| 2691817 | 12/1993 | European Pat. Off. . |
| 6-291219 | 10/1994 | Japan . |
| 7-201937 | 8/1995 | Japan . |

*Primary Examiner*—Lee Young
*Assistant Examiner*—Sean Smith
*Attorney, Agent, or Firm*—Burns, Doane, Swecker & Mathis, L.L.P.

[57] ABSTRACT

The present invention relates to a method for the parallel production of circuitry and software for a customised integrated circuit, primarily an ASIC-type circuit, mounted on a printed board assembly or circuit board (300). The method comprises connecting a programmable logic circuit (345) which replaces the customised integrated circuit during the development phase. The programmable logic circuit (345) is mounted on the secondary side of the circuit board (300) and its connections are passed through (330) the circuit board (300) to the circuits (305, 310) and components (320, 325) to which the customised integrated circuit will be connected.

The invention also relates to a method and to a device respectively for developing and verifying customised integrated circuits per se. In this case, a programmable logic circuit designed as a logic analyser is mounted on the secondary side of the circuit board and connected to the customised integrated circuit through the board.

10 Claims, 5 Drawing Sheets

METHODS AND DEVICES RELATING TO CIRCUIT BOARD CONSTRUCTIONS

FIELD OF INVENTION

The present invention relates to a method of producing circuitry that includes one or more customised integrated circuits, primarily application specific integrated circuits, ASIC. The method is mainly intended to enable parallel production of circuit boards and software for customised integrated circuits, although it is also suitable for application in the development and verification of the customised integrated circuit per se.

The invention also relates to a method of verifying the function of a customised integrated circuit.

The invention also pertains to a device for verifying the function of a customised integrated circuit.

BACKGROUND OF THE INVENTION

It is known from Japanese Patent Publication JP-6291219 to use a special module in the development of systems that include ASICs. The module stands apart from the system during development work, and can thereby be constructed separately. In addition to an ASIC, the module also includes matching and interference-suppression circuits and a clock generator placed on the same side of a circuit board as the ASIC, and a processor which is placed on the other side of said circuit board. In series production, the module is replaced by an ASIC, which is mounted directly onto a circuit board.

Patent Publication JP-7201937 teaches a capsule for integrated circuits that allows signals to be measured within an integrated circuit. The object of the capsule is to reduce test costs in the development of integrated circuits of the ASIC kind, for instance.

SUMMARY OF THE INVENTION

When practising the method taught by JP-6291219, it is necessary to prototype a completely novel circuit board when having found a system that functions satisfactorily. This method of procedure is both time-consuming and expensive, since a completely new circuit board must be produced in the series production of the circuitry.

Although the solution described in publication JP-7201937 enables a specific, customised integrated circuit to be measured, it does not solve the problems that are associated with the prototyping of software and circuit boards for a customised integrated circuit.

Accordingly, one object of the present invention is to enable the construction and testing of customised integrated circuits directly on the circuit board that will later be used in series-production, i.e. without requiring the use of a special test board.

The present invention also aims at enabling the parallel development of software for the customised integrated circuit and for the circuit board in general.

Another object of the invention is to provide an effective prototype solution that allows a circuit board which includes a customised integrated circuit to be tested in a virtual environment prior to the fabrication of the customised circuit.

In addition, the invention enables the logic function of a customised integrated circuit mounted on a circuit board to be readily verified.

According to a third aspect, the present invention relates to a method of prototyping circuitry for a circuit board. One or more programmable logic elements and peripheral logic required by said logic element or elements are mounted on the rear side of a circuit board, i.e. on that side of the board which normally carries no circuits or components. The programmable logic circuit has the same logic function as that which a customised integrated circuit that has still not been produced is perceived to have. The connections of the programmable logic circuit are passed through the circuit board and connected to other board-mounted circuits and components, in the same way as the customised circuit will be connected. The entire system comprised of the circuit board and its circuits and components is then tested. If the system functions as desired, the programmable logic circuit is removed and replaced by the customised integrated circuit as soon as the circuit becomes available. The customised integrated circuit is mounted in the same place as the programmable logic circuit, but on the opposite side of the circuit board.

If, however, the system does not function as desired, the software of the programmable logic circuit and/or the circuitry on the circuit board is/are modified. The function is then tested and the system modified until the set specifications are fulfilled.

According to a second aspect, the invention relates to a method of verifying the function of a customised integrated circuit. A programmable logic circuit designed as a logic analyser is mounted on the rear side of a circuit board. The programmable logic circuit is designed to measure and analyse output signals from a customised integrated circuit mounted on the front side of the circuit board, subsequent to having delivered certain predetermined input signals to said integrated circuit and having executed given software. The programmable logic circuit is connected to the customised integrated circuit, whereafter said predetermined input signals are delivered to this latter circuit. The output signals of the customised integrated circuit are registered and analysed with the aid of the programmable logic circuit.

One embodiment of the proposed device for verifying the function of a customised integrated circuit on a circuit board includes a test unit and a logic analyser, which are mutually connected by a connecting unit. The logic analyser is comprised of a programmable logic circuit which is designed to this end and which is connected to the customised integrated circuit from the rear side, or secondary side, of the circuit board.

The invention makes the production of new customised integrated circuits more effective, by virtue of enabling one and the same circuit board to be used for testing purposes and for mass-production. When only one circuit board need be fabricated, the invention thus reduces the development costs for the complete circuitry on the board.

The invention allows other circuit board circuits and components to be tested in parallel with the development of software for the customised integrated circuit, therewith also enabling the time taken to develop the complete circuitry to be shortened.

The present invention enables a prototype circuit for an integrated circuit to be created without needing to use a special circuit board when testing the prototype circuit.

The invention also enables new functions to be added to an existing customised integrated circuit by connecting-up a programmable logic circuit immediately beneath the customised integrated circuit, said programmable logic circuit implementing said new functions.

Because when practising the inventive methods, the requisite test equipment is mounted solely on the underside of the circuit board, there will not be generated on the underside of said circuit board during the testing phase solder pads that will remain unused in the mass-produced version of the circuit board. This simplifies and makes more effective both manual and mechanical inspection of the finished circuit board.

The invention will now be described in more detail with reference to preferred embodiments thereof and also with reference to the accompanying drawings.

DESCRIPTION OF PREFERRED EMBODIMENTS

Figure 1:
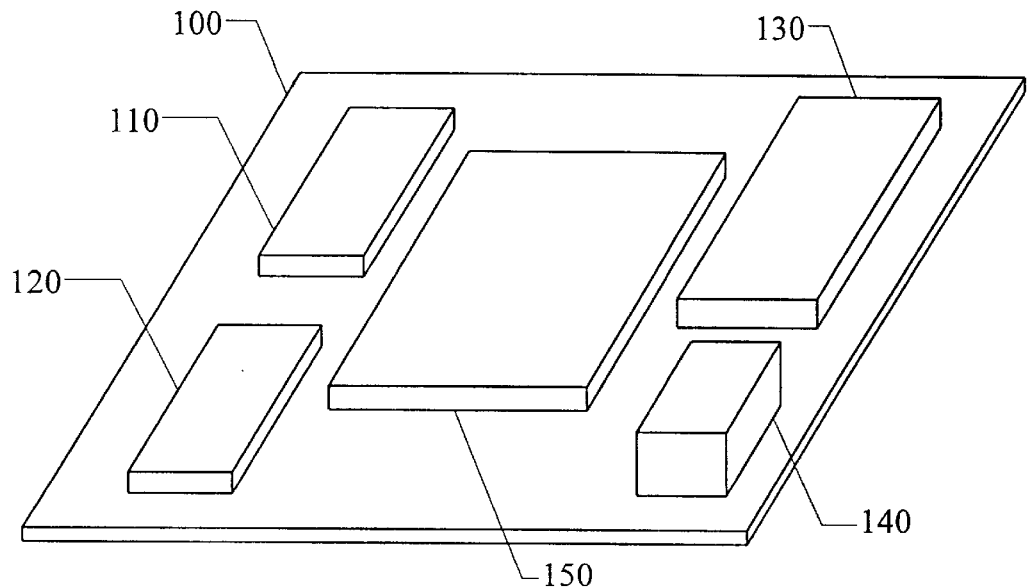
FIG. 1 illustrates a prototype circuit board with which a logic circuit is used in a typical manner during the creation of circuitry and software for a customised integrated circuit.
Figure 2:
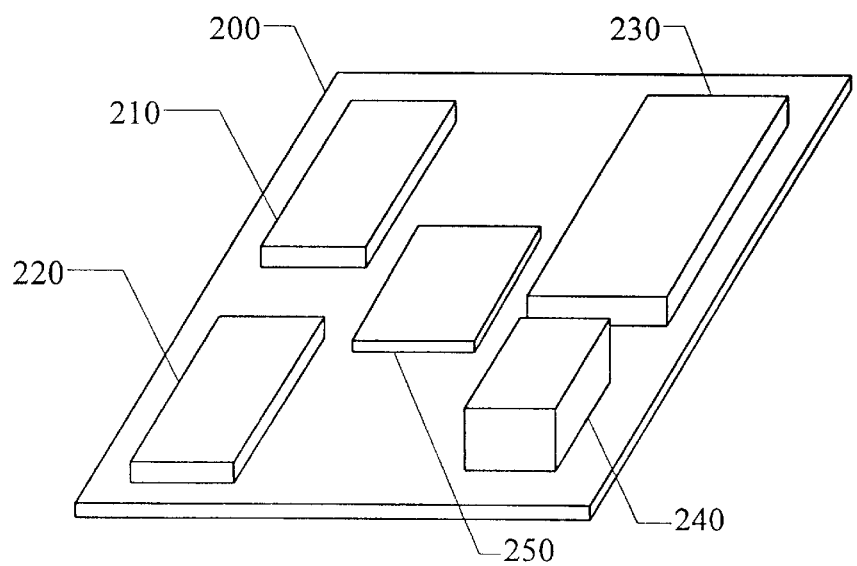
FIG. 2 illustrates a circuit board intended for mass-production and which has mounted thereon a customised integrated circuit produced in accordance with the aforesaid method.

FIG. 1 illustrates a typical prototype circuit board 100 with which a programmable logic circuit 150 is utilised in creating circuitry and software for a customised integrated circuit 250, this circuit being illustrated in FIG. 2. The prototype circuit board, or printed board assembly 100 must have larger dimensions than the mass-produced circuit board 200, since the programmable logic circuit 150 is much larger than the customised integrated circuit 250. Also mounted on the circuit board 100 are other circuits 110, 120 and components 130, 140. The programmable logic circuit 150 has a logic function which is identical to the intended function of the customised integrated circuit 250. The function of the logic circuit 150 in relation to the remaining circuits 110, 120 and to the components 130, 140 can be tested by installing test software in the programmable logic circuit 150 and applying input signals thereto. Appropriate test equipment is connected to the logic circuit 150 for measuring the output signals from the programmable logic circuit 150. The software and circuitry is modified until they function satisfactorily together with the programmable logic circuit 150. In exceptional cases, it may also be necessary to modify the actual configuration of the logic circuit 150.

Subsequent to achieving circuitry and software for the customised integrated circuit 250 that fulfil the specifications set with respect thereto, a new circuit board 200 on which the customised integrated circuit 250 is mounted is produced in accordance with said earlier known method. The connections of the integrated circuit 250 with remaining circuits 210, 220 and with components 230, 240 on the board 200 correspond to the connections used with the programmable logic circuit 150 on the prototype circuit board 100 during the prototype phase. FIG. 2 illustrates a circuit board 200 for mass-production.

Figure 3:
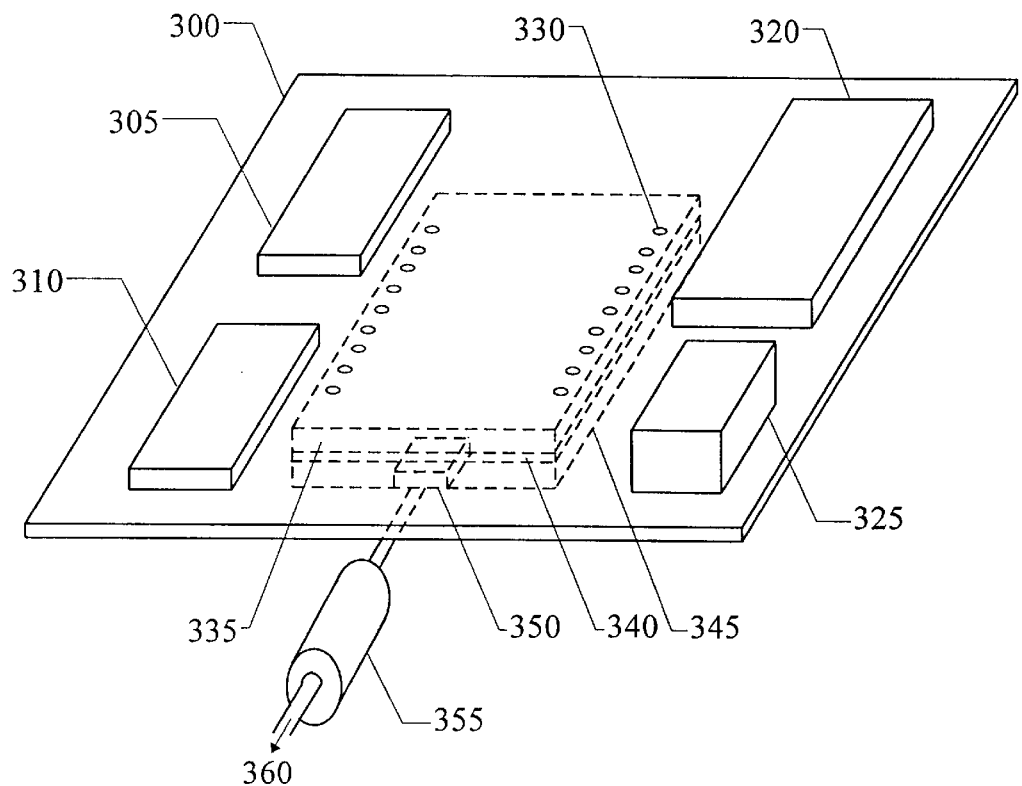
FIG. 3 illustrates a circuit board having a programmable logic circuit mounted on the secondary surface thereof during development work, in accordance with the invention.

FIG. 3 illustrates a circuit board 300 with which a programmable logic circuit 345, for instance an FPGA circuit (FPGA=Field Programmable Gate Array) has been mounted on the secondary side of the board 300, in accordance with a first embodiment of the invention. The programmable logic circuit 345 is connected to circuits 305, 310 and to components 320, 325 on the primary side of the board 300, through the medium of through-penetrating holes 330. The circuit 345 is connected to the circuit board 300 via a compensating unit 340 and a mounting base 335. The compensating unit 340 compensates for the extra conductor length occurring between the programmable logic circuit 345 and the circuit board 300 in comparison with the case when a customised integrated circuit is placed directly on the primary side of the circuit board 300. An electrical contact unit 350 connects the programmable logic circuit 345 to test equipment 360, via a connecting unit 355.

Test software is installed in the programmable logic circuit 345 and input signals are applied thereto. The function of the logic circuit 345 is tested in relation to the remaining circuits 305, 310 on the circuit board 300 and in relation to the components 320, 325 mounted thereon. The test equipment registers the output signals from the programmable logic circuit 345 and the output signals then analysed either manually or mechanically. The software and circuitry are then modified until they function satisfactorily together with the programmable logic circuit 345. In exceptional cases, it may also be necessary to modify the actual logic circuit 345.

Figure 4:
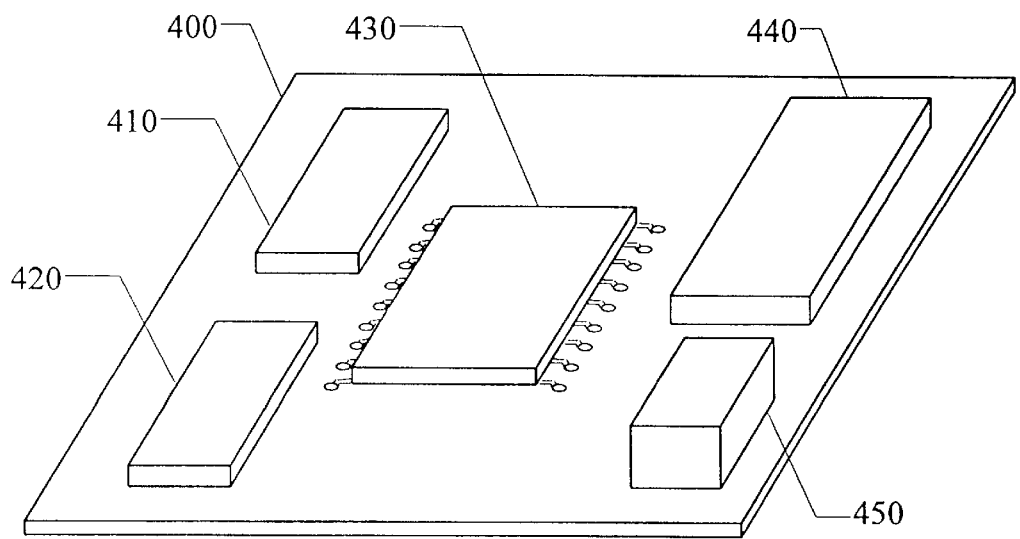
FIG. 4 illustrates a circuit board intended for mass-production.

FIG. 4 illustrates mounting of a customised integrated circuit board 430 on the primary side of the circuit board 400, subsequent to having achieved circuitry and software that fulfil the prescribed specifications. The customised integrated circuit board 430 is connected to other circuits 410, 420 and components 440, 450 in the same manner as that used to connect the programmable logic circuit 345 during the test phase.

Figure 5:
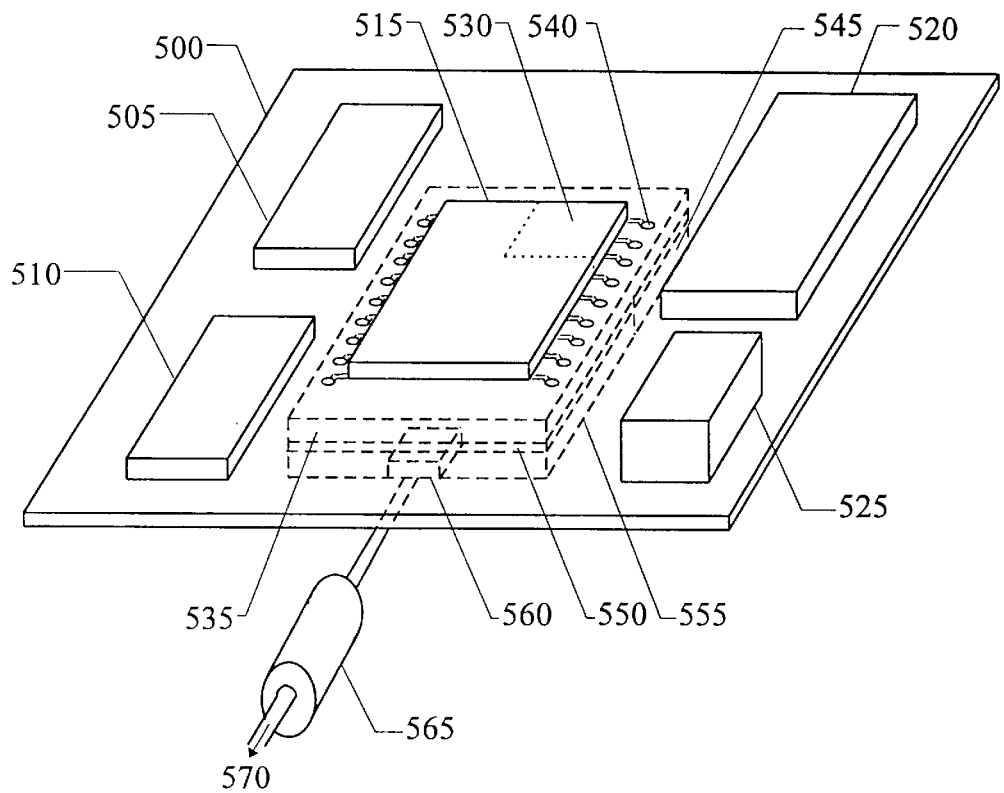
FIG. 5 illustrates a circuit board with which a programmable logic circuit is used to verify the function of a customised integrated circuit in accordance with the invention.

Should the customised integrated circuit be found to contain at least one function block which is known to be wrong, a programmable logic circuit is connected to the customised integrated circuit on the secondary side of the circuit board. FIG. 5 illustrates a circuit board 500 on which a customised integrated circuit 515 is assumed to have a faulty function block 530. This function block 530 is blocked and replaced with a corresponding, correct function block which is implemented through functions in a first programmable logic circuit 545. This circuit 545 is in contact with the primary side of the circuit board, via a compensating unit 550, a mounting base 535, and through-penetrating holes 550. Naturally, such a method assumes that the function block 530 of the customised integrated circuit 515 can be blocked by some form of external influence. The international standard Boundary-Scan Architecture and IEEE Std. 1149.1 disclose a method by means of which function blocks in, e.g., an ASIC can be isolated.

A circuit comprised of non-isolated function blocks in the customised integrated circuit 515 and the first programmable logic circuit 545 can then be tested in relation to remaining circuits 505, 510 on the circuit board and components 520, 525 mounted thereon, by using a second programmable logic circuit 555. This circuit 555 is connected to the customised integrated circuit 515 and the first programmable logic circuit 545 via the compensating unit 550 and the mounting base 535, and forwards measuring signals to test equipment 570, through an electrical contact 560 and a connection unit 565.

Figure 6:
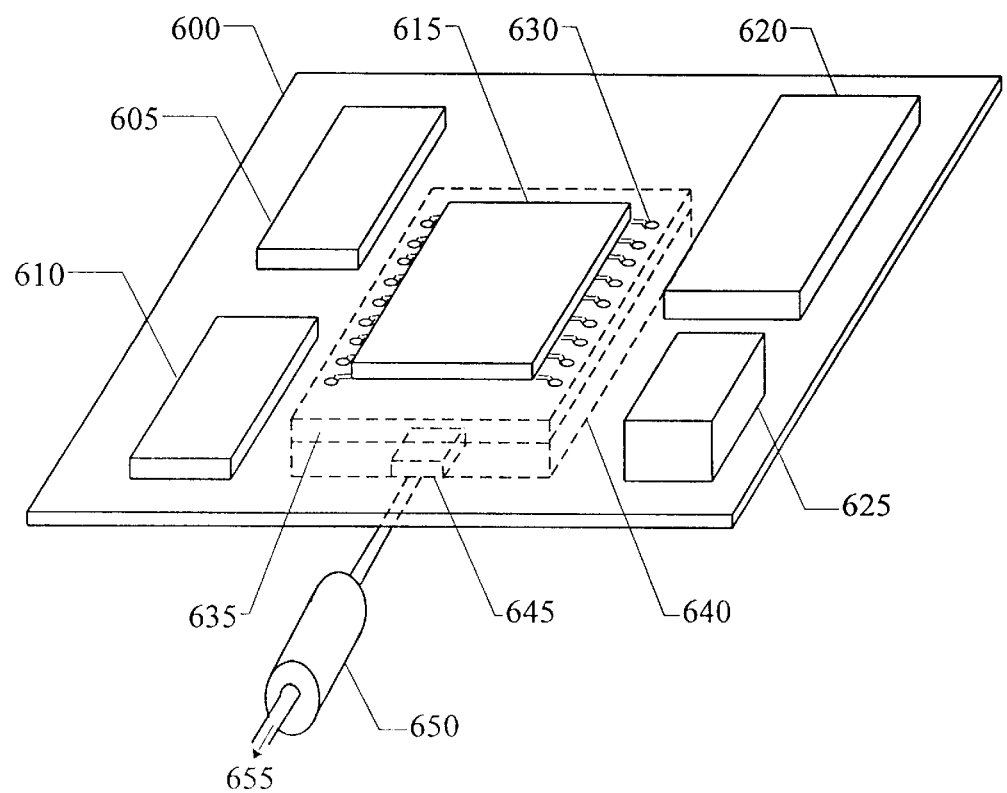
FIG. 6 illustrates a circuit board which includes both a programmable logic circuit and a customised integrated circuit in accordance with the invention.

FIG. 6 illustrates a circuit board 600 with which a programmable logic circuit 640 is connected on the secondary side of the circuit board 600. The logic circuit 640 is designed as a logic analyser and is able to verify the function of a customised integrated circuit 615 mounted on the primary side of the circuit board 600.

The programmable logic circuit 640 is connected to the customised integrated circuit 615 via a mounting base 635 and through-penetrating holes 630. The programmable logic circuit 640 is also connected to external test equipment 655, via an electrical contact unit 645 and a matching unit 650. The measurement values obtained from the customised integrated circuit 615 are registered in the test equipment 655 and analysed, thereby enabling conclusions to be drawn with respect to the function of the customised integrated circuit 615.

Figure 7:
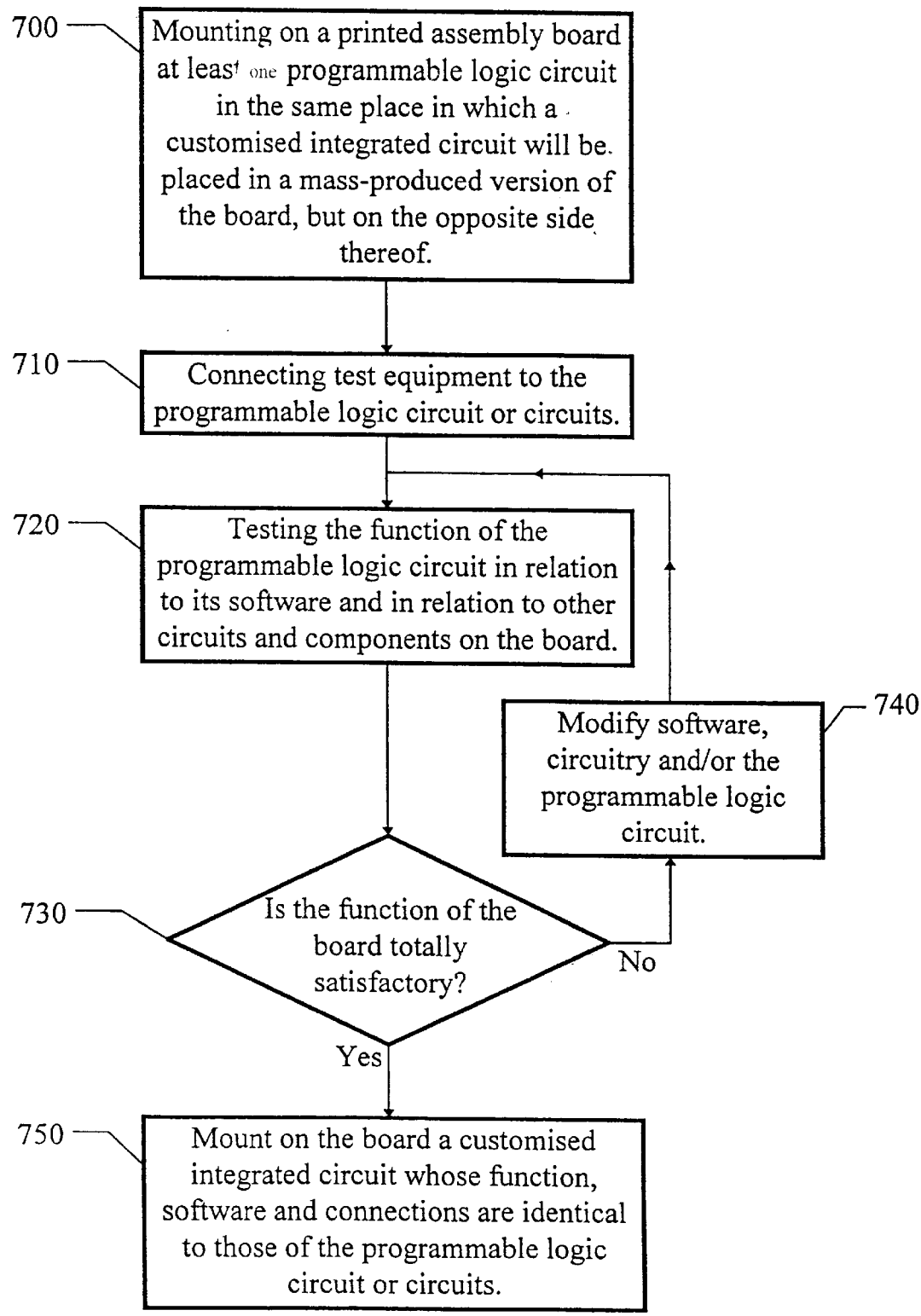
FIG. 7 is a flowchart that illustrates the first inventive method.

FIG. 7 is a flowchart relating to a first embodiment of the inventive method. The method results in a circuit board intended for mass-production and including a customised integrated circuit. In a first step 700, at least one programmable logic circuit is mounted on the secondary side of a printed board assembly, or circuit board, i.e. on that side of the board on which no circuits or components are normally mounted. In the last step 750 of the inventive method, a customised integrated circuit is placed in position in essentially the same manner although on the primary side of the circuit board. Test equipment is connected to the programmable logic circuit in a second step 710 of the inventive method. The following step 720 includes testing of the function of the programmable circuit in relation to other board-mounted circuits and components. If the function of the programmable circuit is found to be satisfactory, in accordance with step 730, there is mounted on the primary side of the circuit board a customised integrated circuit whose function, software and electrical connections coincide with or are identical to those of the programmable logic circuit.

If, on the other hand, the function is not found to be satisfactory, in accordance with step 730, the software, circuitry and/or in exceptional cases also the function of the programmable logic circuit is modified. However, it is normally desirable to avoid modifying the programmable logic circuit, since a customised circuit having an identical function is normally in the process of being manufactured on this occasion.

Figure 8:
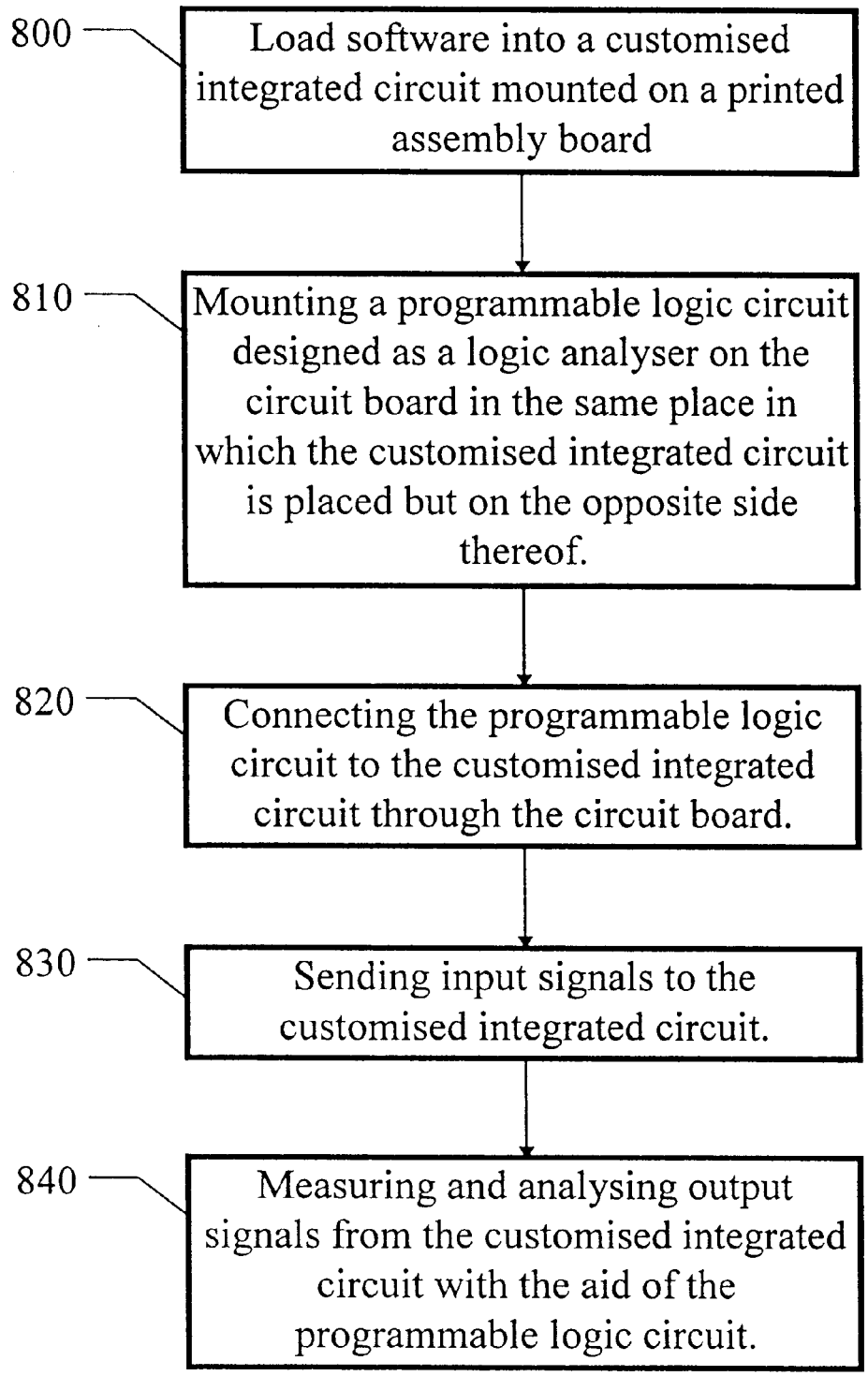
FIG. 8 is a flowchart that illustrates the second inventive method.

FIG. 8 is a flowchart relating to a second embodiment of the inventive method. The purpose of this method is to verify the function of a customised integrated circuit mounted on the primary side of a circuit board. Software is loaded into the customised integrated circuit in a first method step 800. In the next step 810, a programmable logic circuit designed as a logic analyser is mounted on the secondary side of the circuit board. In the next following step 820, the programmable logic circuit is connected to the customised integrated circuit through the circuit board. Input signals are then delivered to the customised integrated circuit in method step 830. Finally, the output signals from the customised integrated circuit are measured and analysed in step 840, with the aid of the programmable logic circuit.

What is claimed is:

1. A method of producing a printed board assembly with a given circuitry that includes circuits, components and a customised integrated circuit to which input signals are delivered and which is controlled by software, the circuits, components, and customized integrated circuit are mounted on a primary side of the board, the board having a secondary side opposite the primary side the method comprises the steps of:
   (i) mounting at least one first programmable logic circuit on the secondary side of the board;
   (ii) ascertaining whether or not the function of the first programmable logic circuit is satisfactory in relation to said circuits and said components mounted on the printed board assembly when input signals are applied to said logic circuit and when said software is executed in said circuit; and
   (iii) removing and replacing the first programmable logic circuit by mounting a customised integrated circuit having the same functions and connections as those of the first programmable logic circuit on said primary side of the board.

2. A method according to claim 1, wherein step (i) further comprises connecting a compensating unit between the secondary side of the circuit board and the first programmable logic circuit, said compensating unit functioning to compensate for an additional conductor length between the first programmable logic circuit and the circuit board in relation to a conductor length between the customised integrated circuit and said board-mounted circuits and board-mounted components.

3. A method according to claim 1, further comprising the step of:
   (iv) modifying the software and/or the circuitry in the event of an unsatisfactory result of step (ii).

4. A method according to claim 1, wherein step (ii) further comprises using separate test equipment connected to the programmable logic circuit in ascertaining whether or not the function of the first programmable logic circuit is satisfactory in relation to said circuits and said components.

5. A method according to claim 4, further comprising connecting the test equipment to the programmable logic circuit through a matching unit and an electrical contact unit.

6. A method according to claim 1, wherein upon detection of at least one faulty function block in the customised integrated circuit, the method further comprises the steps of:
   (iv) mounting a second programmable logic circuit on the secondary side of the circuit board;
   (v) connecting said second programmable logic circuit to the customised integrated circuit;
   (vi) isolating said function block in the customised integrated circuit;
   (vii) generating a corrected version of said function block in said second programmable logic circuit; and
   (viii) again testing whether or not the respective functions of the customised integrated circuit and said second programmable logic circuit together function satisfactorily in relation to said board-mounted circuits and components, when executing said software in the customised integrated circuit and said second programmable logic circuit.

7. A method according to claim 6, wherein the connection of said second programmable logic circuit to the customised integrated circuit also includes the connection of a compensating unit between said second programmable logic circuit and the customised integrated circuit in order to compensate for an additional conductor length between said second programmable logic circuit and the primary side of the circuit board in relation to a conductor length between the customised integrated circuit and said circuit-board mounted circuits and components.

8. A method of verifying the function of a customised integrated circuit to which input signals are delivered, which delivers output signals, which is controlled by software, and which is mounted on a primary side of a printed board assembly comprising the steps of:
  (i) mounting a programmable logic circuit designed as a logic analyser on the secondary side of the circuit board;
  (ii) connecting the programmable logic circuit to the customised integrated circuit;
  (iii) measuring and analysing the output signals from the customised integrated circuit with the aid of said programmable logic circuit, subsequent to having delivered said input signals to said customised integrated circuit and executing its software; and
  (iv) removing the programmable logic circuit from the secondary side of the circuit board subsequent to step (iii).

9. A device for verifying the function of a customised integrated circuit mounted on a primary side of a printed board assembly or circuit board, said device including a test unit and a logic analyser which are mutually connected through the medium of a connection unit, wherein the logic analyser comprises a programmable logic circuit that is temporarily and releasably connected to the customised integrated circuit from a secondary side of the circuit board via a mounting base and through-penetrating holes.

10. A device according to claim 9, wherein the logic analyser is connected to the connection unit via a contact unit.

* * * * *